United States Patent
Ajima et al.

(10) Patent No.: US 12,088,274 B2
(45) Date of Patent: Sep. 10, 2024

(54) ACOUSTIC WAVE DEVICE

(71) Applicant: Murata Manufacturing Co., Ltd., Nagaokakyo (JP)

(72) Inventors: Daisuke Ajima, Nagaokakyo (JP); Takuya Koyanagi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 596 days.

(21) Appl. No.: 17/465,906

(22) Filed: Sep. 3, 2021

(65) Prior Publication Data

US 2021/0399711 A1 Dec. 23, 2021

Related U.S. Application Data

(63) Continuation of application No. PCT/JP2020/010594, filed on Mar. 11, 2020.

(30) Foreign Application Priority Data

Mar. 11, 2019 (JP) ................. 2019-043359

(51) Int. Cl.
*H03H 9/02* (2006.01)
*H03H 3/08* (2006.01)
(Continued)

(52) U.S. Cl.
CPC .......... *H03H 9/02637* (2013.01); *H03H 3/08* (2013.01); *H03H 9/02992* (2013.01); *H03H 9/1457* (2013.01); *H03H 9/25* (2013.01)

(58) Field of Classification Search
CPC .......... H03H 9/02637; H03H 9/02992; H03H 9/1457; H03H 9/25; H03H 9/02535
(Continued)

(56) References Cited

U.S. PATENT DOCUMENTS

2016/0126928 A1* 5/2016 Ruile ............... H03H 9/25
310/313 B
2017/0222619 A1 8/2017 Iwamoto et al.
(Continued)

FOREIGN PATENT DOCUMENTS

WO 2016/084526 A1 6/2016
WO 2018/123882 A1 7/2018
(Continued)

OTHER PUBLICATIONS

Official Communication issued in International Patent Application No. PCT/JP2020/010594, mailed on Jun. 9, 2020.

*Primary Examiner* — Derek J Rosenau
(74) *Attorney, Agent, or Firm* — Keating & Bennett, LLP

(57) ABSTRACT

An acoustic wave device includes a piezoelectric substrate, an interdigital transducer electrode on the piezoelectric substrate, and reflectors. The interdigital transducer electrode includes first and second busbars including first and second cavities in a first direction, and first and second edge regions and first and second gap regions. The first and second edge regions include low acoustic velocity regions. Regions in which the first and second cavities are provided include high acoustic velocity regions. The reflector includes first and second reflector busbars and first reflection electrode fingers each including a second end portion that faces the second reflector busbar. The first reflection electrode fingers overlap the entire or substantially the entire second gap region when viewed in the first direction.

17 Claims, 7 Drawing Sheets

(51) Int. Cl.
*H03H 9/145* (2006.01)
*H03H 9/25* (2006.01)

(58) Field of Classification Search
USPC ...... 310/313 R, 313 A, 313 B, 313 C, 313 D
See application file for complete search history.

(56) References Cited

U.S. PATENT DOCUMENTS

2019/0305747 A1 10/2019 Takigawa
2020/0067489 A1 2/2020 Takata

FOREIGN PATENT DOCUMENTS

WO 2018/199071 A1 11/2018
WO 2018/225650 A1 12/2018

\* cited by examiner

ACOUSTIC WAVE DEVICE

CROSS REFERENCE TO RELATED APPLICATIONS

This application claims the benefit of priority to Japanese Patent Application No. 2019-043359 filed on Mar. 11, 2019 and is a Continuation Application of PCT Application No. PCT/JP2020/010594 filed on Mar. 11, 2020. The entire contents of each application are hereby incorporated herein by reference.

BACKGROUND OF THE INVENTION

1. Field of the Invention

The present invention relates to an acoustic wave device.

2. Description of the Related Art

Acoustic wave devices are commonly used for filters of cellular phones. In International Publication No. 2018/199071, an acoustic wave device that uses a piston mode is disclosed by way of example. The acoustic wave device includes a reflector and an interdigital transducer electrode on a piezoelectric substrate. A central region, a low acoustic velocity region, and a high acoustic velocity region are arranged in this order from the inside to the outside of the interdigital transducer electrode in a direction in which electrode fingers extend. A busbar of the interdigital transducer electrode includes an inner busbar, an outer busbar, and connection electrodes that connect the inner busbar and the outer busbar to each other. The busbar of the interdigital transducer electrode includes cavities that are surrounded by the inner busbar, the outer busbar, and the connection electrodes.

In International Publication No. 2018/199071, when the busbar is formed, the inner busbar and the connection electrodes are formed by a lift-off method, a resist is separated, and subsequently, the outer busbar is formed so as to cover portions of the connection electrodes.

The use of the structure disclosed in International Publication No. 2018/199071, that is, the piston mode enables the impedance characteristics of the acoustic wave device to be inhibited from deteriorating. However, when the acoustic wave device disclosed in International Publication No. 2018/199071 is manufactured, and the reflector is formed by the lift-off method, it is difficult for a stripping solution for the resist to come into contact with the resist, and consequently, a resist residue remains in some cases. The resist residue poses a risk of the occurrence of a failure, such as a ripple.

SUMMARY OF THE INVENTION

Preferred embodiments of the present invention provide acoustic wave devices that each reduce or prevent resist residues on reflectors from remaining to prevent deterioration in, for example, impedance characteristics.

An acoustic wave device according to a preferred embodiment of the present invention includes a piezoelectric layer, an interdigital transducer electrode on the piezoelectric layer, a pair of reflectors on the piezoelectric layer on both sides of the interdigital transducer electrode in a first direction in which an acoustic wave propagates, and a second direction is perpendicular or substantially perpendicular to the first direction. The interdigital transducer electrode includes a first busbar and a second busbar that face each other and that include cavities in the first direction, first electrode fingers each of which includes one end portion connected to the first busbar, and second electrode fingers each of which includes one end portion connected to the second busbar. The second electrode fingers are interdigitated with the first electrode fingers. An intersection region is defined as a region in which the first electrode fingers and the second electrode fingers overlap in the first direction, and the intersection region includes a central region located at a center in the second direction, a first edge region located between the central region and the first busbar, and a second edge region located between the central region and the second busbar. The interdigital transducer electrode includes a first gap region located between the first edge region and the first busbar, and a second gap region located between the second edge region and the second busbar. The first edge region and the second edge region include respective low acoustic velocity regions in which an acoustic velocity is lower than that in the central region, and regions in which the cavities of the first busbar and the second busbar are provided include respective high acoustic velocity regions in which an acoustic velocity is higher than that in the central region. Each of the reflectors includes a first reflector busbar in a vicinity of the first busbar of the interdigital transducer electrode, a second reflector busbar facing the first reflector busbar in a vicinity of the second busbar, and a first reflection electrode finger including one end portion connected to the first reflector busbar and another end portion that faces the second reflector busbar with a gap interposed therebetween. The first reflection electrode finger overlaps an entirety or substantially an entirety of the second gap region of the interdigital transducer electrode when viewed in the first direction.

Acoustic wave devices according to preferred embodiments of the present invention each reducing or preventing resist residues on reflectors remaining without deterioration in, for example, impedance characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will hereinafter be described with reference to the drawings to clarify the present invention.

Preferred embodiments of the present invention will be described by way of example in the present specification. Features can be partially replaced or combined between different preferred embodiments.

Figure 1:
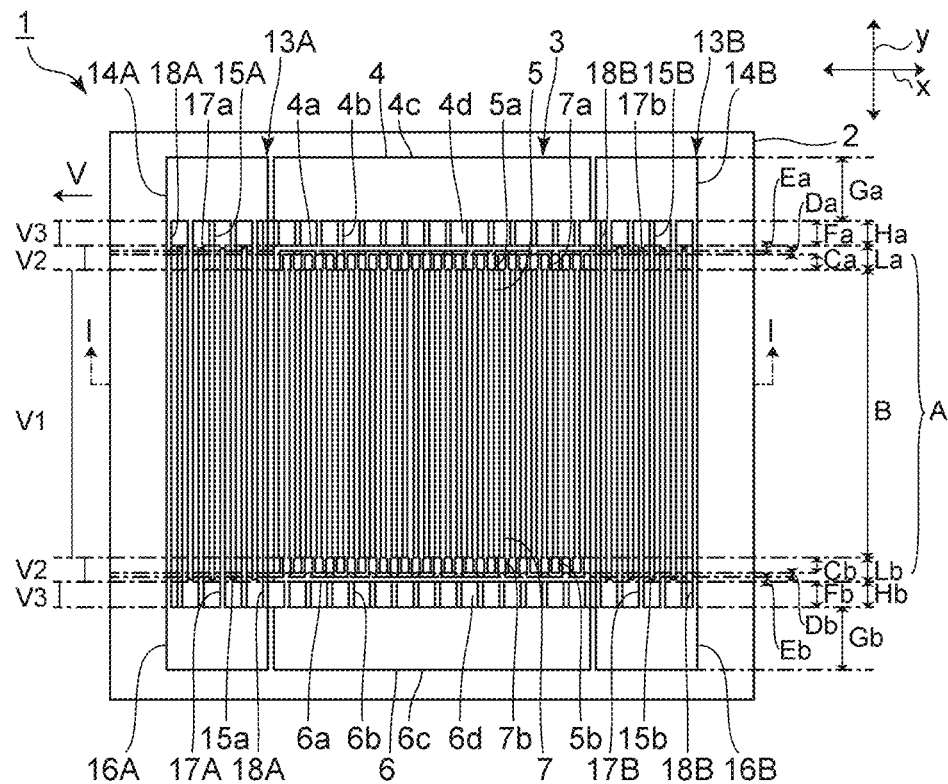
FIG. 1 is a plan view of an acoustic wave device according to a first preferred embodiment of the present invention.

FIG. 1 is a plan view of an acoustic wave device according to a first preferred embodiment of the present invention.

As illustrated in FIG. 1, an acoustic wave device 1 includes a piezoelectric substrate 2. The piezoelectric substrate 2 is, for example, a piezoelectric substrate that includes only a piezoelectric layer. More specifically, the piezoelectric substrate 2 of the acoustic wave device 1 is, for example, a lithium niobate substrate. The material of the piezoelectric substrate 2, however, is not limited to the above description and may be, for example, a piezoelectric single crystal, such as lithium tantalate or appropriate piezoelectric ceramics. The piezoelectric substrate 2 may have a multilayer body that includes the piezoelectric layer.

An interdigital transducer electrode 3 is disposed on the piezoelectric substrate 2. An alternating voltage is applied to the interdigital transducer electrode 3 to excite an acoustic wave. A pair of a reflector 13A and a reflector 13B are disposed on both sides of the interdigital transducer electrode 3 on the piezoelectric substrate 2 in a first direction x, where the first direction x is a direction in which the acoustic wave propagates, and a second direction y is a direction perpendicular or substantially perpendicular to the first direction x. The acoustic wave device 1 according to the present preferred embodiment is an acoustic wave resonator, for example. The acoustic wave device 1, however, is not limited to the acoustic wave resonator and may be, for example, a filter device that includes acoustic wave resonators.

Figure 2:
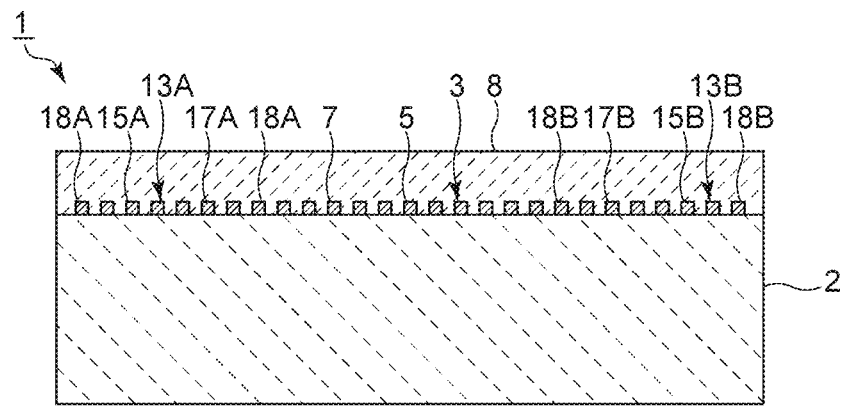
FIG. 2 is a sectional view taken along line I-I in FIG. 1.

FIG. 2 is a sectional view taken along line I-I in FIG. 1.

The acoustic wave device 1 includes the interdigital transducer electrode 3 on the piezoelectric substrate 2 and a dielectric film 8 that covers the reflector 13A and the reflector 13B. According to the present preferred embodiment, the dielectric film 8 is, for example, a silicon oxide film. Silicon oxide is expressed as $SiO_a$, where a represents a freely selected positive number. More specifically, according to the present preferred embodiment, the silicon oxide film is, for example, a $SiO_2$ film. The material of the dielectric film 8, however, is not limited to silicon oxide. The dielectric film 8 is not necessarily provided.

Figure 3:
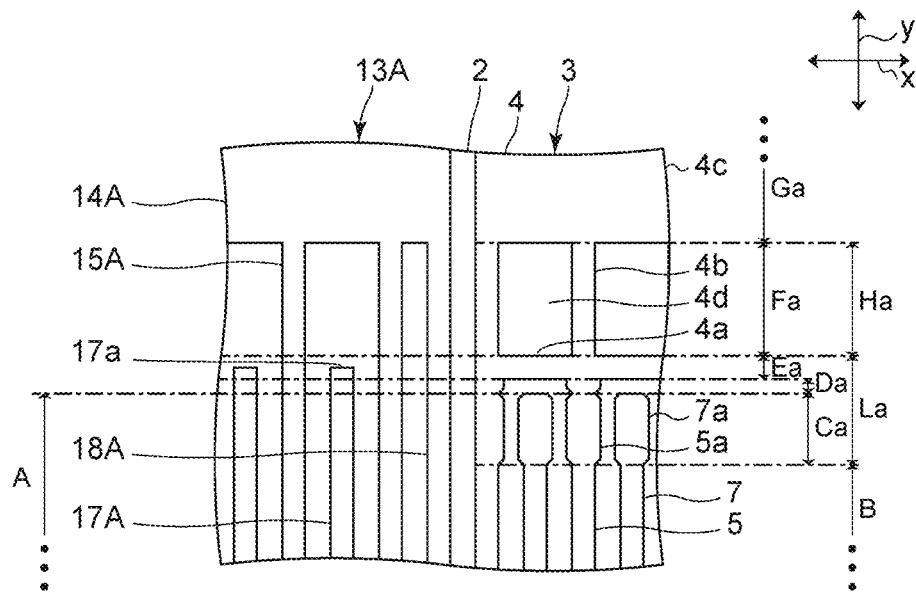
FIG. 3 is an enlarged view of FIG. 1.
Figure 4:
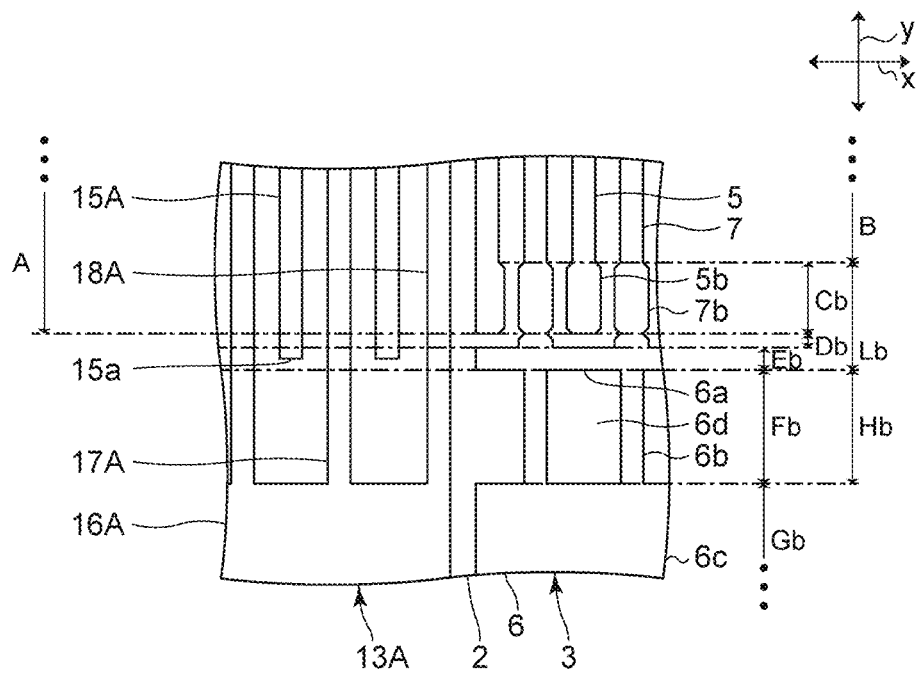
FIG. 4 is an enlarged view of FIG. 1.

FIG. 3 is an enlarged view of FIG. 1. FIG. 4 is an enlarged view of FIG. 1.

As illustrated in FIG. 1, FIG. 3, and FIG. 4, the interdigital transducer electrode 3 includes a first busbar 4 and a second busbar 6 that face each other. As illustrated in FIG. 1 and FIG. 3, the first busbar 4 includes first cavities 4d in the first direction x. As illustrated in FIG. 1 and FIG. 4, the second busbar 6 includes second cavities 6d in the first direction x. The interdigital transducer electrode 3 includes first electrode fingers 5 each of which includes one end portion that is connected to the first busbar 4. Another end portion of each first electrode finger 5 faces the second busbar 6 with a gap interposed therebetween. The first electrode fingers 5 and the second busbar 6 are not connected to each other. The interdigital transducer electrode 3 includes second electrode fingers 7 each of which includes one end portion that is connected to the second busbar 6. Another end portion of each second electrode finger 7 faces the first busbar 4 with a gap interposed therebetween. The second electrode fingers 7 and the first busbar 4 are not connected to each other. The first electrode fingers 5 and the second electrode fingers 7 are interdigitated with each other.

The reflector 13A includes a first reflector busbar 14A and a second reflector busbar 16A that face each other. The first reflector busbar 14A is in a vicinity of the first busbar 4 of the interdigital transducer electrode 3. The second reflector busbar 16A is in a vicinity of the second busbar 6. The reflector 13B includes a first reflector busbar 14B and a second reflector busbar 16B that face each other. The first reflector busbar 14B is in a vicinity of the first busbar 4 of the interdigital transducer electrode 3. The second reflector busbar 16B is in a vicinity of the second busbar 6.

As illustrated in FIG. 3 and FIG. 4, the reflector 13A includes first reflection electrode fingers 15A that are connected to the first reflector busbar 14A. Each first reflection electrode finger 15A includes a first end portion and a second end portion 15a. The first end portion of each first reflection electrode finger 15A is connected to the first reflector busbar 14A. As illustrated in FIG. 4, the second end portion 15a of each first reflection electrode finger 15A faces the second reflector busbar 16A. The first reflection electrode fingers 15A and the second reflector busbar 16A are not connected to each other. That is, there is a gap between the second end portion 15a of each first reflection electrode finger 15A and the second reflector busbar 16A.

The reflector 13A includes second reflection electrode fingers 17A that are connected to the second reflector busbar 16A. Each second reflection electrode finger 17A includes a third end portion and a fourth end portion 17a. The third end portion of each second reflection electrode finger 17A is connected to the second reflector busbar 16A. As illustrated in FIG. 3, the fourth end portion 17a of each second reflection electrode finger 17A faces the first reflector busbar 14A. The second reflection electrode fingers 17A and the first reflector busbar 14A are not connected to each other. That is, there is a gap between the fourth end portion 17a of each second reflection electrode finger 17A and the first reflector busbar 14A. The first reflection electrode fingers 15A and the second reflection electrode fingers 17A are interdigitated with each other.

As illustrated in FIG. 1, the reflector 13A includes two third reflection electrode fingers 18A that are connected to the first reflector busbar 14A and the second reflector busbar 16A. That is, there is no gap between one end portion of each third reflection electrode finger 18A and the first reflector busbar 14A and between another end portion of each third reflection electrode finger 18A and the second reflector busbar 16A. Among the reflection electrode fingers of the reflector 13A, one of the third reflection electrode fingers 18A is nearest to the interdigital transducer electrode 3. Among the reflection electrode fingers of the reflector 13A, the other third reflection electrode finger 18A is farthest from the interdigital transducer electrode 3. The number and positions of the third reflection electrode fingers 18A are not limited to the above description. The reflector 13B includes the first reflector busbar 14B, the second reflector busbar 16B, first reflection electrode fingers 15B, second reflection electrode fingers 17B, and third reflection electrode fingers 18B as in the reflector 13A.

Among the first reflection electrode fingers 15A, the second reflection electrode fingers 17A, and the third reflection electrode fingers 18A of the reflector 13A, at least the first reflection electrode fingers 15A is sufficient. However, the reflector 13A preferably includes the second reflection electrode fingers 17A. This enables the degree of symmetry of the reflector 13A to be increased and makes a filter characteristic unlikely to deteriorate. The reflector 13A preferably includes the third reflection electrode fingers 18A, for example. This enables the entire reflector 13A to have the same potential and makes the filter characteristic more unlikely to deteriorate. The same is true for the reflector 13B.

The interdigital transducer electrode 3, the reflector 13A, and the reflector 13B may include a multilayer metal film of stacked metal layers or may include a metal film of a single layer.

The structure of the interdigital transducer electrode 3 according to the present preferred embodiment will now be described in more detail.

An intersection region A is defined as a region of the interdigital transducer electrode 3 at which the first electrode fingers 5 and the second electrode fingers 7 overlap in the first direction x. The intersection region A includes a central region B that is located at the center in the second direction y.

The intersection region A includes a first edge region Ca that is located between the central region B and the first busbar 4 and a second edge region Cb that is located between the central region B and the second busbar 6. The interdigital transducer electrode 3 includes a first gap region Da that is located between the first edge region Ca and the first busbar 4 and a second gap region Db that is located between the second edge region Cb and the second busbar 6.

As illustrated in FIG. 3, the first busbar 4 of the interdigital transducer electrode 3 includes a first inner busbar region Ea that is located in a vicinity of the intersection region A and a first outer busbar region Ga that is located outside the first inner busbar region Ea in the second direction y. A first inner busbar portion 4a is defined as a portion of the first busbar 4 that is located in the first inner busbar region Ea. A first outer busbar portion 4c is defined as a portion of the first busbar 4 that is located in the first outer busbar region Ga. The first busbar 4 includes a first cavity formation region Fa that is located between the first inner busbar region Ea and the first outer busbar region Ga where the first cavities 4d are provided. The first busbar 4 includes first connection electrodes 4b that connect the first inner busbar portion 4a and the first outer busbar portion 4c to each other. The first cavities 4d are surrounded by the first inner busbar portion 4a, the first outer busbar portion 4c, and the first connection electrodes 4b.

The first connection electrodes 4b extend so as to be located on extension lines from the first electrode fingers 5. Here, a dimension of each electrode finger in the first direction x is referred to as a width. A dimension of each connection electrode in the first direction x is referred to as a width. The width of each first connection electrode 4b is equal or substantially equal to the width of each first electrode finger 5. The arrangement of the first connection electrodes 4b is not limited to the above description. For example, the first connection electrodes 4b may extend so as to be located on extension lines from the second electrode fingers 7. The width of each first connection electrode 4b may differ from the width of each first electrode finger 5.

Similarly, as illustrated in FIG. 4, the second busbar 6 of the interdigital transducer electrode 3 includes a second inner busbar region Eb, a second outer busbar region Gb, and a second cavity formation region Fb in which the second cavities 6d described above are provided. A second inner busbar portion 6a is defined as a portion that is located in the second inner busbar region Eb. A second outer busbar portion 6c is defined as a portion that is located in the second outer busbar region Gb. The second busbar 6 includes second connection electrodes 6b that connect the second inner busbar portion 6a and the second outer busbar portion 6c to each other. The second cavities 6d are surrounded by the second inner busbar portion 6a, the second outer busbar portion 6c, and the second connection electrodes 6b.

According to the present preferred embodiment, as illustrated in FIG. 3, the fourth end portion 17a of each second reflection electrode finger 17A of the reflector 13A overlaps the first inner busbar region Ea when viewed in the first direction x. The fourth end portion 17a thus overlaps a portion outside the first gap region Da in the second direction y when viewed in the first direction x, and the second reflection electrode fingers 17A overlap the whole of the first gap region Da. In the present specification, a boundary between regions is not included in the regions that are separated by the boundary. For example, the first inner busbar region Ea includes neither the boundary between the first inner busbar region Ea and the first gap region Da nor the boundary between the first inner busbar region Ea and the first cavity formation region Fa. The fourth end portion 17a of each second reflection electrode finger 17A overlaps a portion between the boundary between the first inner busbar region Ea and the first gap region Da and the boundary between the first inner busbar region Ea and the first cavity formation region Fa when viewed in the first direction x. In the following description, overlapping when it is viewed in the first direction x is simply referred to as overlapping in some cases.

As illustrated in FIG. 4, the second end portion 15a of each first reflection electrode finger 15A of the reflector 13A overlaps the second inner busbar region Eb when viewed in the first direction x. The second end portion 15a thus overlaps a portion outside the second gap region Db in the second direction y when viewed in the first direction x, and the first reflection electrode fingers 15A overlap the whole of the second gap region Db. More specifically, the second end portion 15a of each first reflection electrode finger 15A overlaps a portion between the boundary between the second inner busbar region Eb and the second gap region Db and the boundary between the second inner busbar region Eb and the second cavity formation region Fb when viewed in the first direction x.

Similarly, as illustrated in FIG. 1, a second end portion 15b of each first reflection electrode finger 15B of the reflector 13B overlaps the second inner busbar region Eb, and the first reflection electrode fingers 15B overlap the entire or substantially the entire second gap region Db when viewed in the first direction x. More specifically, the second end portion 15b of each first reflection electrode finger 15B overlaps a portion between the boundary between the second inner busbar region Eb and the second gap region Db and the boundary between the second inner busbar region Eb and the second cavity formation region Fb when viewed in the first direction x.

A fourth end portion 17b of each second reflection electrode finger 17B of the reflector 13B overlaps the first inner busbar region Ea, and the second reflection electrode fingers 17B overlap the entire or substantially the entire first gap region Da when viewed in the first direction x. More specifically, the fourth end portion 17b of each second reflection electrode finger 17B overlaps a portion between the boundary between the first inner busbar region Ea and the first gap region Da and the boundary between the first inner busbar region Ea and the first cavity formation region Fa when viewed in the first direction x.

In the present specification, a phrase such as an object "overlaps a region (or a portion between a boundary and a boundary" means that the object overlaps at least a portion of the region (or the portion between the boundary and the boundary).

As illustrated in FIG. 3, each first electrode finger 5 of the interdigital transducer electrode 3 includes a first wide portion 5a that is located in the first edge region Ca and that has a width more than that of a portion in the central region B. Similarly, each second electrode finger 7 includes a first wide portion 7a that is located in the first edge region Ca. Consequently, an acoustic velocity in the first edge region Ca is lower than an acoustic velocity in the central region B. A first low acoustic velocity region La in which the average acoustic velocity is lower than the acoustic velocity in the central region B thus extends from the first edge region Ca to the first inner busbar region Ea. In the present specification, the acoustic velocity is a velocity at which the acoustic wave propagates in the first direction x.

As illustrated in FIG. 4, each first electrode finger 5 includes a second wide portion 5b that is located in the second edge region Cb and that has a width more than that of the portion in the central region B. Similarly, each second electrode finger 7 includes a second wide portion 7b that is located in the second edge region Cb. A second low acoustic velocity region Lb in which the average acoustic velocity is lower than the acoustic velocity in the central region B thus extends from the second edge region Cb to the second inner busbar region Eb.

It is sufficient that each first electrode finger 5 or each second electrode finger 7 illustrated in FIG. 1, or both include the first wide portion 5a or the first wide portion 7a. It is sufficient that each first electrode finger 5 or each second electrode finger 7, or both include the second wide portion 5b or the second wide portion 7b. The first low acoustic velocity region La may be provided in a manner in which a mass addition film is disposed on a portion of each first electrode finger 5 or a portion of each second electrode finger 7 that is located in the first edge region Ca, or both. The same is true for the second edge region Cb. The first low acoustic velocity region La and the second low acoustic velocity region Lb may be provided in a manner in which the first wide portion 5a, the first wide portion 7a, the second wide portion 5b, the second wide portion 7b, and the mass addition film are provided.

Here, V2<V1 is satisfied where V1 is the acoustic velocity in the central region B, and V2 is the acoustic velocity in the first low acoustic velocity region La and the second low acoustic velocity region Lb.

The first connection electrodes 4b in the first cavity formation region Fa are located on the extension lines from the first electrode fingers 5 but are not located on extension lines from the second electrode fingers 7. Consequently, the acoustic velocity in the first cavity formation region Fa is higher than the acoustic velocity in the central region B. A first high acoustic velocity region Ha thus extends in the first cavity formation region Fa. Similarly, a second high acoustic velocity region Hb in which the acoustic velocity is higher than the acoustic velocity in the central region B extends in the second cavity formation region Fb. Here, V1<V3 is satisfied where V3 is the acoustic velocity in the first high acoustic velocity region Ha and the second high acoustic velocity region Hb.

A relationship among the acoustic velocities in the regions satisfies V2<V1<V3. The relationship among the acoustic velocities described above is illustrated in FIG. 1. The relationship among the acoustic velocities is illustrated in FIG. 1 by using an arrow V such that as lines representing heights for the acoustic velocities shift to the left, the acoustic velocities increase.

The central region B, the first low acoustic velocity region La, and the first high acoustic velocity region Ha are provided in this order in the second direction y. Similarly, the central region B, the second low acoustic velocity region Lb, and the second high acoustic velocity region Hb are provided in this order in the second direction y. The acoustic wave device 1 thus uses a piston mode. This enables the energy of the acoustic wave to be confined and spuriosity due to a higher-order transverse mode to be reduced. Consequently, the impedance characteristics of the acoustic wave device 1 are reduced or prevented from deteriorating.

In the present preferred embodiment, the reflector 13A includes the first reflection electrode fingers 15A that are not connected to the second reflector busbar 16A, and the first reflection electrode fingers 15A overlap the entire or substantially the entire second gap region Db of the interdigital transducer electrode 3 when viewed in the first direction x. In the present preferred embodiment, the reflector 13B also includes the first reflection electrode fingers 15B that are not connected to the second reflector busbar 16B, and the first reflection electrode fingers 15B overlap the entire or substantially the entire second gap region Db of the interdigital transducer electrode 3 when viewed in the first direction x. Consequently, resist residues on the reflector 13A and the reflector 13B are unlikely to remain without deterioration in, for example, the impedance characteristics. This will now be described together with a non-limiting example of a method of manufacturing the acoustic wave device 1.

Figure 5:
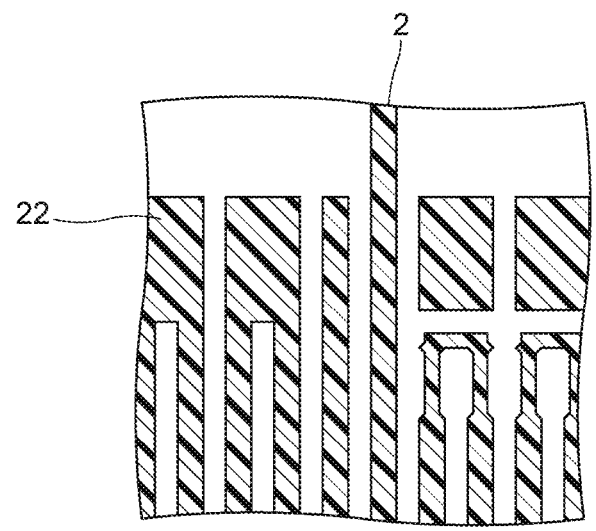
FIG. 5 is an enlarged plan view for describing an example of a method of manufacturing the acoustic wave device according to the first preferred embodiment of the present invention.
Figure 6:
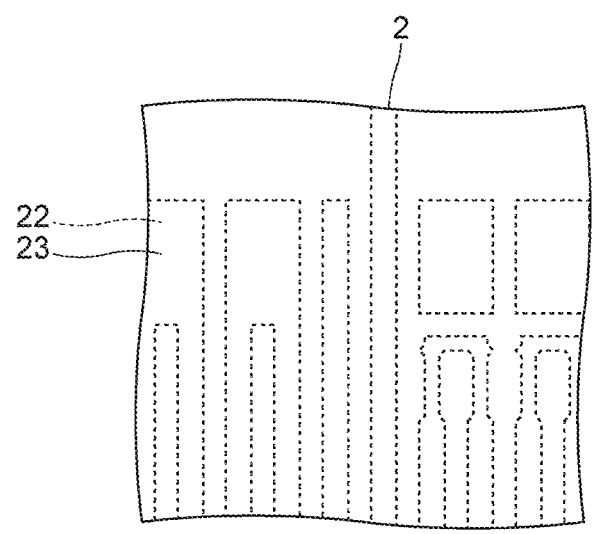
FIG. 6 is an enlarged plan view for describing the example of the method of manufacturing the acoustic wave device according to the first preferred embodiment of the present invention.

FIG. 5 is an enlarged plan view for describing the example of the method of manufacturing the acoustic wave device according to the first preferred embodiment. FIG. 6 is an enlarged plan view for describing the example of the method of manufacturing the acoustic wave device according to the first preferred embodiment.

As illustrated in FIG. 5, the piezoelectric substrate 2 is prepared. Subsequently, a resist layer is formed on the piezoelectric substrate 2. The resist layer can be formed by, for example, a printing method or a spin coating method.

Subsequently, a resist pattern 22 is formed in a manner in which the resist layer is exposed to light and subsequently developed. At this time, the resist layer is continuous in a vicinity of a portion of the resist pattern 22 at which the second end portion 15a of each first reflection electrode finger 15A of the reflector 13A is to be formed in a plan view. The resist layer is also continuous in a vicinity of a portion of the resist pattern 22 at which the fourth end portion 17a of each second reflection electrode finger 17A of the reflector 13A is to be formed. The same is true for a portion of the resist pattern 22 corresponding to the reflector 13B. This enables regions between the reflector busbars and the reflection electrode fingers to be provided in addition to regions between the reflection electrode fingers. Accordingly, a continuous, wide region that is surrounded by the reflector busbars and the reflection electrode fingers can be provided.

Subsequently, as illustrated in FIG. 6, a metal film 23 for forming the interdigital transducer electrode 3, the reflector 13A, and the reflector 13B is formed on the piezoelectric substrate 2 so as to cover the resist pattern 22. The metal film 23 is formed by a vacuum deposition method or a sputtering method, for example.

Subsequently, the resist pattern 22 is separated. At this time, portions of the resist pattern 22 corresponding to the reflector 13A and the reflector 13B include portions at which the resist layer is continuous as described above. Consequently, the continuous, wide region that is surrounded by the reflector busbars and the reflection electrode fingers can be provided, and a stripping solution for the resist is likely to come into contact with the resist. This enables the resist pattern 22 to be readily separated with more certainty. According to the present preferred embodiment, the resist residues are unlikely to remain.

The fact that the impedance characteristics of the acoustic wave device 1 are unlikely to deteriorate will now be described by comparing the present preferred embodiment, a first comparative example, and a second comparative example.

Figure 7:
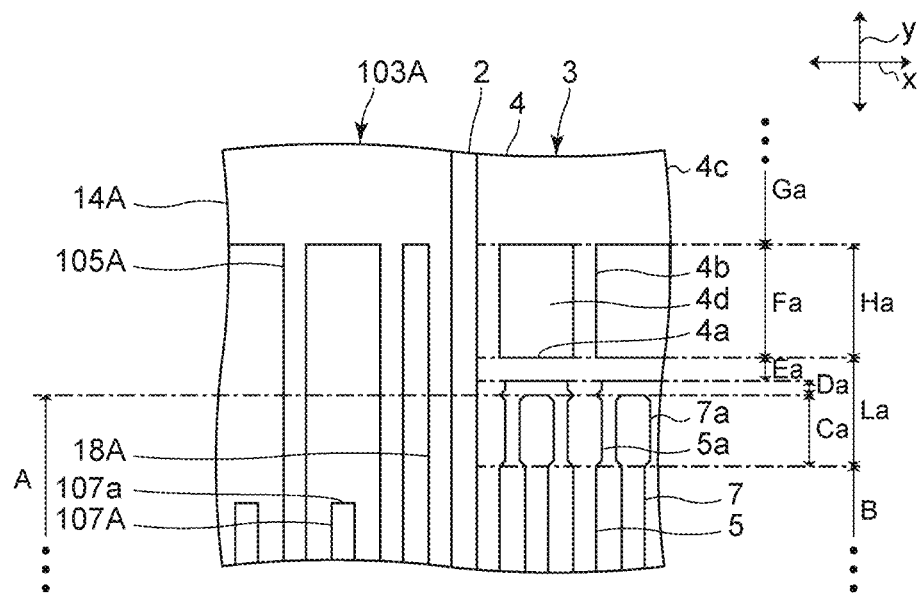
FIG. 7 is an enlarged plan view of an acoustic wave device in a first comparative example.
Figure 8:
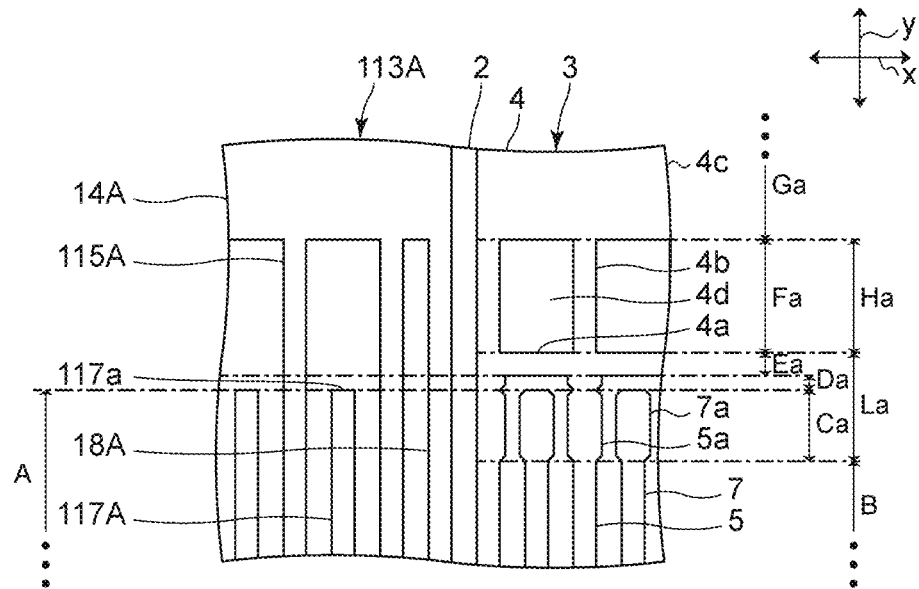
FIG. 8 is an enlarged plan view of an acoustic wave device in a second comparative example.

In the first comparative example and the second comparative example, second reflection electrode fingers do not overlap a first gap region, and first reflection electrode fingers do not overlap a second gap region when viewed in the first direction. More specifically, as illustrated in FIG. 7, the first comparative example differs from the first preferred embodiment in that a fourth end portion 107a of each second reflection electrode finger 107A overlaps the intersection region A of the interdigital transducer electrode 3 when viewed in the first direction x. In addition, the first comparative example differs from the first preferred embodiment in that a second end portion of each first reflection electrode finger 105A overlaps the intersection region A. As illustrated in FIG. 8, the second comparative example differs from the first preferred embodiment in that a fourth end portion 117a of each second reflection electrode finger 117A overlaps the boundary between the first edge region Ca and the first gap region Da when viewed in the first direction x. In addition, the second comparative example differs from the first preferred embodiment in that a second end portion of each first reflection electrode finger 115A overlaps the boundary between the second edge region Cb and the second gap region Db.

The acoustic wave device that has the structure according to the first preferred embodiment, and the acoustic wave devices in the first comparative example and the second comparative example were prepared, and the impedance frequency characteristics were measured. The conditions of the acoustic wave device that has the structure according to the first preferred embodiment, and the acoustic wave devices in the first comparative example and the second comparative example are as follows. The wavelength that is defined by the electrode finger pitch of the interdigital transducer electrode is denoted as λ. The length of the intersection region A in the second direction y is referred to as an intersection width. In some cases, thickness obtained by standardizing thickness h by using the wavelength λ is expressed below as h/λ×100(%) where h is the thickness.

Wavelength of Interdigital Transducer Electrode: about 4 μm

Duty in Intersection Region A of Interdigital Transducer Electrode: about 0.5

Number of Pairs of Electrode Fingers of Interdigital Transducer Electrode: about 30 pairs Intersection Width of Interdigital Transducer Electrode: about 15 λ

Material and Thickness of Interdigital Transducer Electrode: Material . . . platinum (Pt), Thickness . . . about 8%

Number of Pairs of Reflection Electrode fingers of Reflector: 5 pairs

Material and Thickness of Dielectric Film: Material . . . Silicon Oxide ($SiO_2$), Thickness . . . about 35%

Material of Piezoelectric Substrate: Lithium Niobate ($LiNbO_3$)

Euler angles (φ, θ, ψ) of Piezoelectric Substrate: Euler angles (0°, 30°, 0°)

The conditions, however, are described above by way of example, and the conditions of the acoustic wave device according to preferred embodiments of the present invention are not limited to the above description.

Figure 9:
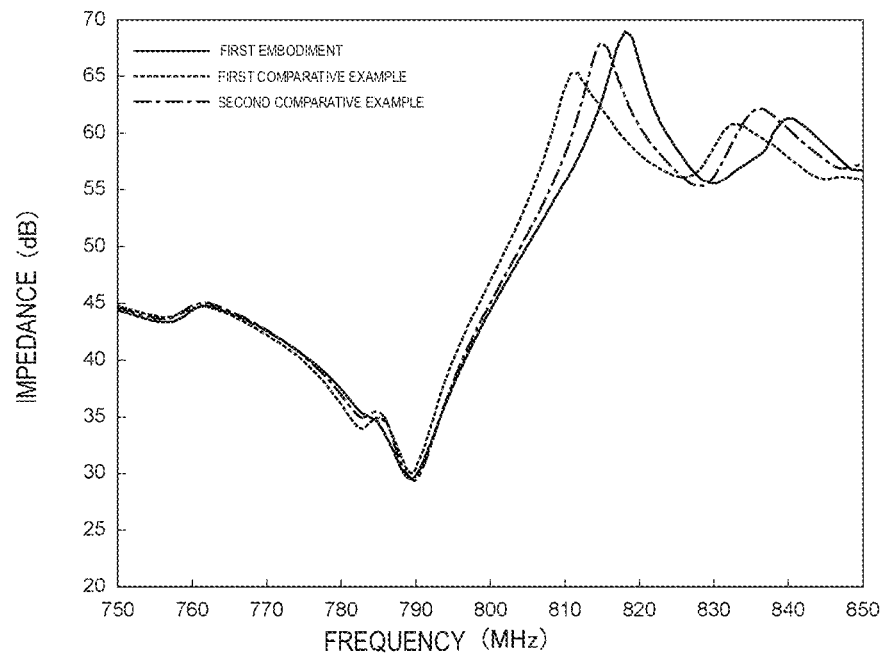
FIG. 9 illustrates the impedance frequency characteristics of the acoustic wave device according to the first preferred embodiment of the present invention and the acoustic wave devices in the first comparative example and the second comparative example.

FIG. 9 illustrates the impedance frequency characteristics of the acoustic wave device according to the first preferred embodiment and the acoustic wave devices in the first comparative example and the second comparative example. In FIG. 9, a solid line represents the result of the first preferred embodiment, a dashed line represents the result of the first comparative example, and a one-dot chain line represents the result of the second comparative example.

According to the first preferred embodiment, as illustrated in FIG. 9, the impedance at the resonant frequency is lower than that in the first comparative example. The impedance at the resonant frequency in the first preferred embodiment is the same or substantially the same as that in the second comparative example. According to the first preferred embodiment, the impedance at the anti-resonant frequency is much higher than those in the first comparative example and the second comparative example. According to the first preferred embodiment, the impedance characteristics are thus less likely to deteriorate than in the first comparative example and the second comparative example in the same measurement conditions as the first comparative example and second comparative example.

In the first comparative example and the second comparative example, the first reflection electrode fingers of reflectors do not overlap the second gap region of the interdigital transducer electrode when viewed in the first direction, and the second reflection electrode fingers do not overlap the first gap region of the interdigital transducer electrode. For this reason, it is difficult to sufficiently reflect a main mode that is excited in the interdigital transducer electrode by using the reflectors near the first gap region and near the second gap region. Accordingly, the main mode is likely to leak. For this reason, as illustrated in FIG. 9, the impedance characteristics are likely to deteriorate.

According to the first preferred embodiment illustrated in FIG. 1, however, the first reflection electrode fingers 15A of the reflector 13A and the first reflection electrode fingers 15B of the reflector 13B overlap the entire or substantially the entire second gap region Db of the interdigital transducer electrode 3 when viewed in the first direction x. The second reflection electrode fingers 17A of the reflector 13A and the second reflection electrode fingers 17B of the reflector 13B overlap the entire or substantially the entire first gap region Da. This enables the main mode that is excited in the interdigital transducer electrode 3 to be sufficiently reflected by the reflector 13A and the reflector 13B over the entire or substantially the entire first gap region Da, the entire or substantially the entire intersection region A, and the entire or substantially the entire second gap region Db. In the first high acoustic velocity region Ha and the second high acoustic velocity region Hb, there is substantially no energy of the acoustic wave. For this reason, it is not necessary to reflect the main mode by using the reflector 13A and the reflector 13B. That is, it is not necessary for the first high acoustic velocity region Ha and the second high acoustic velocity region Hb to overlap ends of the reflection electrode fingers of the reflector 13A and the reflector 13B when viewed in the first direction x. In addition, according to the first preferred embodiment, the resist can be readily separated with more certainty when the reflector 13A and the reflector 13B are structured as described above. According to the first preferred embodiment, the resist residues can accordingly be unlikely to remain without deterioration in, for example, the impedance characteristics.

Furthermore, according to the present preferred embodiment, the second end portion 15a of each first reflection electrode finger 15A overlaps a portion in the second inner busbar region Eb outside the boundary between the second inner busbar region Eb and the second gap region Db in the second direction y when viewed in the first direction x. Specifically, the second end portion 15a of each first reflection electrode finger 15A overlaps the portion between the boundary between the second inner busbar region Eb and the second gap region Db and the boundary between the second inner busbar region Eb and the second cavity formation region Fb. This enables the first reflection electrode fingers 15A to cover the entire or substantially the entire second gap region Db with more certainty when viewed in the first direction x even through the lengths of the first reflection electrode fingers 15A vary when the reflector 13A is formed. Similarly, the second reflection electrode fingers 17A can cover the entire or substantially the entire first gap region Da with more certainty. The same is true for the reflector 13B. Accordingly, the impedance characteristics, for example, are more unlikely to deteriorate. In addition, the deterioration in the filter characteristic, such as an insertion loss, is unlikely to occur in the case where the acoustic wave device 1 according to the first preferred embodiment is used for a filter device, such as a band pass filter, for example.

First to third modifications of the first preferred embodiment that differ from the first preferred embodiment in that the positions of the end portions of the reflection electrode fingers are changed will now be described. According to the first of third modifications, the resist residues on the reflectors are unlikely to remain without deterioration in, for example, the impedance characteristics as in the first preferred embodiment.

Figure 10:
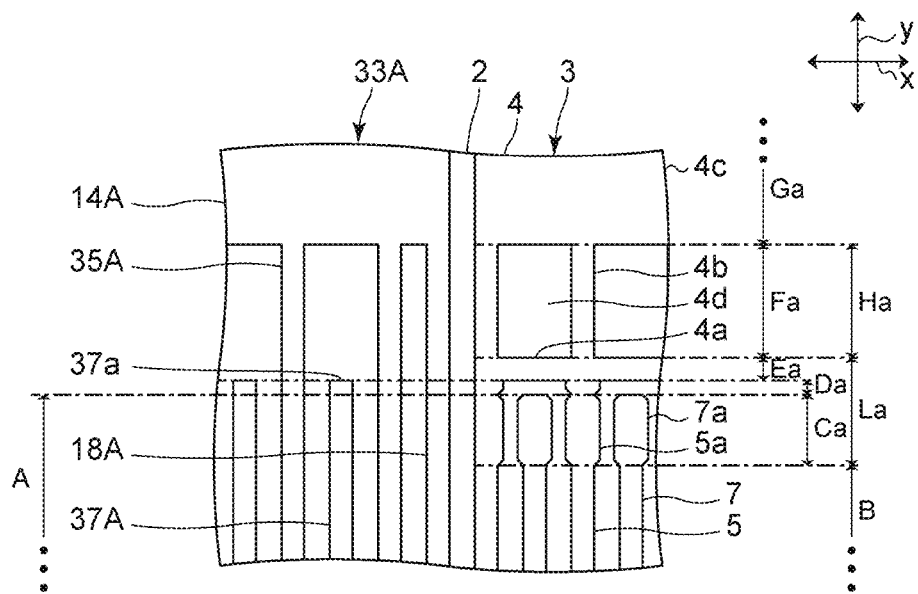
FIG. 10 is an enlarged plan view of an acoustic wave device according to a first modification to the first preferred embodiment of the present invention.

According to the first modification, as illustrated in FIG. 10, a fourth end portion 37a of each of second reflection electrode fingers 37A of a reflector 33A overlaps the boundary between the first inner busbar region Ea and the first gap region Da of the first busbar 4 when viewed in the first direction x. A second end portion of each of first reflection electrode fingers 35A of the reflector 33A overlaps the boundary between the second inner busbar region Eb and the second gap region Db of the second busbar 6 when viewed in the first direction x. The same is true for a reflector that is disposed such that the reflector and the reflector 33A interpose the interdigital transducer electrode 3 therebetween.

Figure 11:
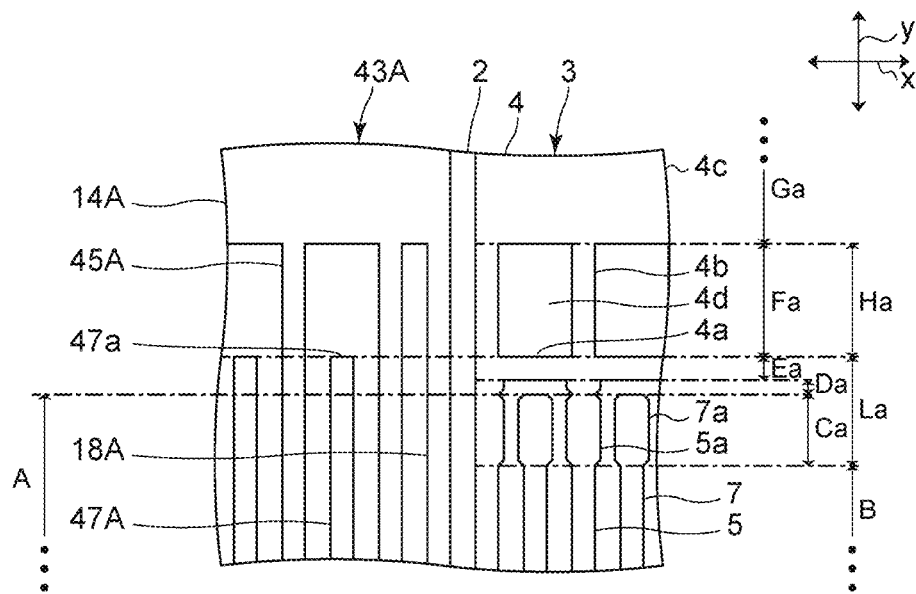
FIG. 11 is an enlarged plan view of an acoustic wave device according to a second modification to the first preferred embodiment of the present invention.

According to the second modification, as illustrated in FIG. 11, a fourth end portion 47a of each of second reflection electrode fingers 47A of a reflector 43A overlaps the boundary between the first inner busbar region Ea and the first cavity formation region Fa of the first busbar 4 when viewed in the first direction x. A second end portion of each of first reflection electrode fingers 45A of the reflector 43A overlaps the boundary between the second inner busbar region Eb and the second cavity formation region Fb of the second busbar 6 when viewed in the first direction x. The same is true for a reflector that is disposed such that the reflector and the reflector 43A interpose the interdigital transducer electrode 3 therebetween. Also, according to the second modification, the second end portion of each first reflection electrode finger 45A overlaps a portion outside the boundary between the second inner busbar region Eb and the second gap region Db in the second direction y when viewed in the first direction x. Accordingly, the whole of the second gap region Db can be covered with more certainty even through the lengths of the first reflection electrode fingers 45A vary.

Figure 12:
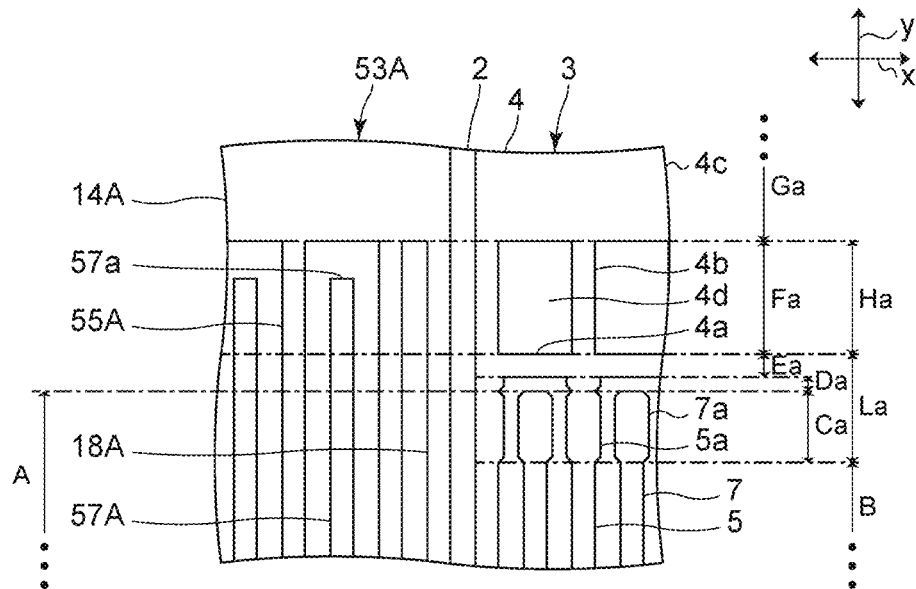
FIG. 12 is an enlarged plan view of an acoustic wave device according to a third modification to the first preferred embodiment of the present invention.

According to the third modification, as illustrated in FIG. 12, a fourth end portion 57a of each of second reflection electrode fingers 57A of a reflector 53A overlaps the first cavity formation region Fa when viewed in the first direction x. A second end portion of each of first reflection electrode fingers 55A of the reflector 53A overlaps the second cavity formation region Fb when viewed in the first direction x. The same is true for a reflector that is disposed such that the reflector and the reflector 53A interpose the interdigital transducer electrode 3 therebetween. Also, according to the third modification, the second end portion of each first reflection electrode finger 55A overlaps a portion outside the boundary between the second inner busbar region Eb and the second gap region Db in the second direction y when viewed in the first direction x. Accordingly, the entire or substantially the entire second gap region Db can be covered with more certainty even through the lengths of the first reflection electrode fingers 55A vary.

Figure 13:
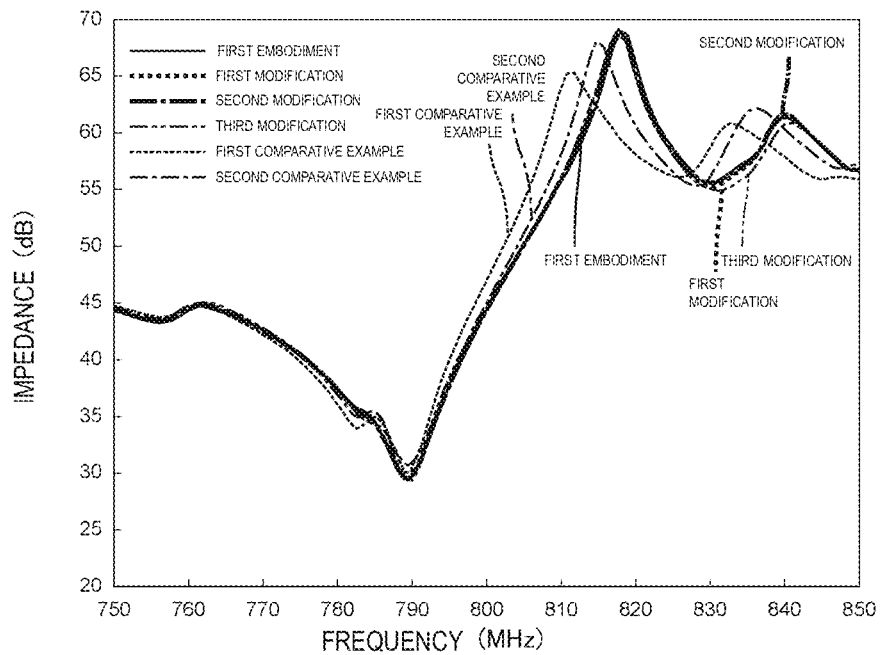
FIG. 13 illustrates the impedance frequency characteristics of the acoustic wave devices according to the first preferred embodiment of the present invention and the first to third modifications of the present invention and the acoustic wave devices in the first comparative example and the second comparative example.

FIG. 13 illustrates the impedance frequency characteristics of the acoustic wave devices according to the first preferred embodiment and the first to third modifications, and the acoustic wave devices in the first comparative example and the second comparative example. A solid line represents the result of the first preferred embodiment, a dashed line represents the result of the first comparative example, and a one-dot chain line represents the result of the second comparative example as in FIG. 9. A thick dashed line represents the result of the first modification, a thick one-dot chain line represents the result of the second modification, and a two-dot chain line represents the result of the third modification.

According to the first to third modifications, as illustrated in FIG. 13, the impedance at the resonant frequency and the impedance at the anti-resonant frequency are the same or substantially the same as those in the first preferred embodiment. According to the first to third modification, the impedance characteristics are thus unlikely to deteriorate as in the first preferred embodiment. In addition, the resist can be readily separated with more certainty when the reflectors are formed as in the first preferred embodiment. Also, according to the first to third modifications, the resist residues on the reflectors are unlikely to remain without deterioration in, for example, the impedance characteristics.

The acoustic wave devices according to preferred embodiments of the present invention may be used as an acoustic wave resonator of a filter device, for example. In an example described below, two acoustic wave devices according to a fourth modification of the first preferred embodiment are used for a ladder filter.

Figure 14:
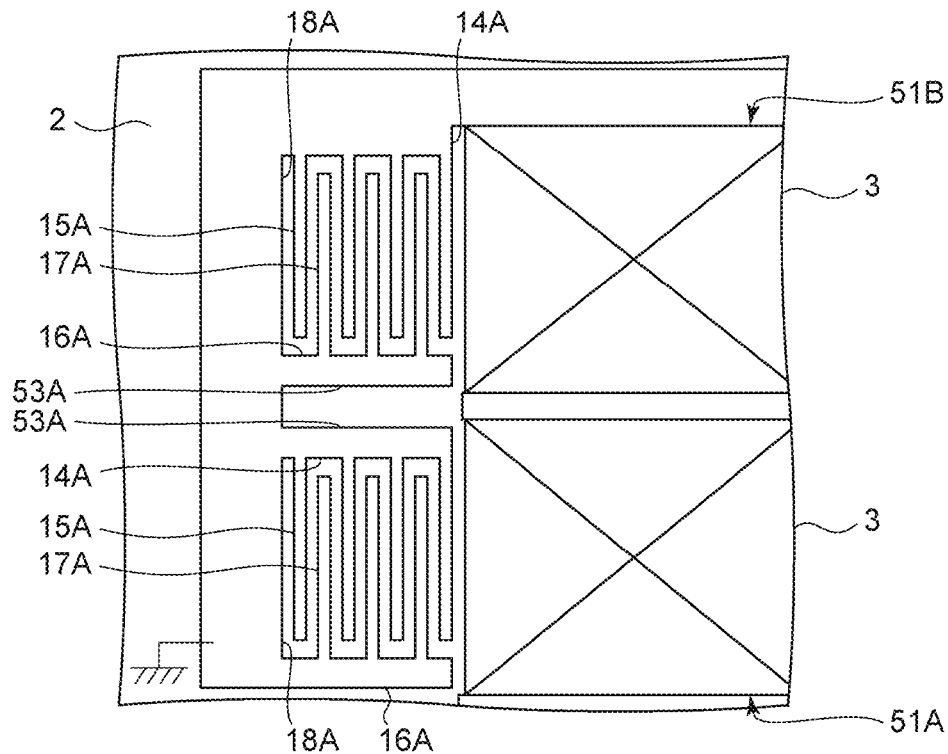
FIG. 14 is a schematic plan view of an example in which two acoustic wave devices according to a fourth modification to the first preferred embodiment of the present invention are used for a filter device.

FIG. 14 is a schematic plan view of an example in which the two acoustic wave devices according to the fourth modification of the first preferred embodiment are used for a filter device. In FIG. 14, each interdigital transducer electrode 3 is schematically illustrated as a rectangle with two diagonals.

In an acoustic wave device 51A according to the fourth modification, the third reflection electrode finger 18A is farthest from the interdigital transducer electrode 3 among the reflection electrode fingers. The same is true for an acoustic wave device 51B. The acoustic wave device 51A and the acoustic wave device 51B are used as parallel arm resonators. The acoustic wave device 51A and the acoustic wave device 51B are connected to each other in series. The first busbar 4 of the interdigital transducer electrode 3 of the acoustic wave device 51B is connected to a ground potential. In FIG. 14, connection to the ground potential is schematically illustrated using a symbol that is used in a circuit diagram. The second busbar 6 of the interdigital transducer electrode 3 of the acoustic wave device 51A is electrically connected to another element of the ladder filter. However, this is not required. For example, the acoustic wave devices according to preferred embodiments of the present invention may be used as series arm resonators. The acoustic wave devices according to preferred embodiments of the present invention may be used as acoustic wave resonators that are electrically connected to a longitudinally coupled resonator acoustic wave filter.

As illustrated in FIG. 14, the reflector 53A of the acoustic wave device 51A and the reflector 53A of the acoustic wave device 51B are electrically connected to each other. More specifically, the third reflection electrode finger 18A of the acoustic wave device 51A and the third reflection electrode finger 18A of the acoustic wave device 51B define and function as a portion of a wiring line that connects the reflectors 53A to each other. The wiring line that is provided by connecting the third reflection electrode fingers 18A to each other is connected to the first reflector busbars 14A and the second reflector busbars 16A of the acoustic wave device 51A and the acoustic wave device 51B. The third reflection electrode fingers 18A may thus be used, for example, as an extending wiring line for connecting the reflectors 53A to each other.

In an example in FIG. 14, the reflectors 53A of the parallel arm resonators are connected to each other but are not limited thereto. For example, the reflectors 53A of series arm resonators may be connected to each other using the extending wiring line including the third reflection electrode fingers 18A. In this case, the reflectors 53A may not be connected to the ground potential. For example, the reflectors 53A and an external connection electrode may be connected to each other using the extending wiring line including the third reflection electrode fingers 18A. That is, objects that are connected to each other using the extending wiring line including the third reflection electrode fingers 18A are not limited to resonators, and may be, for example, a resonator and an electrode connected to the resonator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric layer;
an interdigital transducer electrode on the piezoelectric layer;
a pair of reflectors on the piezoelectric layer on both sides of the interdigital transducer electrode in a first direction in which an acoustic wave propagates, and a second direction is perpendicular or substantially perpendicular to the first direction; wherein
the interdigital transducer electrode includes a first busbar and a second busbar that face each other and that include cavities in the first direction, first electrode fingers each including one end portion connected to the first busbar, and second electrode fingers each including one end portion connected to the second busbar, the second electrode fingers being interdigitated with the first electrode fingers;
an intersection region is defined as a region in which the first electrode fingers and the second electrode fingers overlap in the first direction, and the intersection region includes a central region at a center in the second direction, a first edge region between the central region and the first busbar, and a second edge region between the central region and the second busbar;
the interdigital transducer electrode includes a first gap region between the first edge region and the first busbar, and a second gap region between the second edge region and the second busbar;
the first edge region and the second edge region include respective low acoustic velocity regions in which an acoustic velocity is lower than that in the central region, and regions in which the cavities of the first busbar and the second busbar are provided include respective high acoustic velocity regions in which an acoustic velocity is higher than that in the central region;
each of the reflectors includes a first reflector busbar in a vicinity of the first busbar of the interdigital transducer electrode, a second reflector busbar facing the first reflector busbar and in a vicinity of the second busbar, and a first reflection electrode finger including one end portion connected to the first reflector busbar and another end portion facing the second reflector busbar with a gap interposed therebetween; and
the first reflection electrode finger overlaps an entirety of substantially an entirety of the second gap region of the interdigital transducer electrode when viewed in the first direction.

2. The acoustic wave device according to claim 1, wherein
the first busbar and the second busbar respectively include inner busbar regions in a vicinity of the intersection region and outer busbar regions outside the inner busbar regions in the second direction;
in the first busbar and the second busbar, the regions in which the cavities are provided are between the inner busbar regions and the outer busbar regions; and
the other end portion of the first reflection electrode finger overlaps a portion outside the second gap region in the second direction when viewed in the first direction.

3. The acoustic wave device according to claim 2, wherein the other end portion of the first reflection electrode finger overlaps a boundary between the inner busbar region of the second busbar and the second gap region when viewed in the first direction.

4. The acoustic wave device according to claim 2, wherein the other end portion of the first reflection electrode finger overlaps the inner busbar region of the second busbar when viewed in the first direction.

5. The acoustic wave device according to claim 2, wherein the other end portion of the first reflection electrode finger overlaps a boundary between the inner busbar region of the second busbar and the region in which the cavities of the second busbar are provided when viewed in the first direction.

6. The acoustic wave device according to claim 2, wherein the other end portion of the first reflection electrode finger overlaps the region in which the cavities of the second busbar are provided when viewed in the first direction.

7. The acoustic wave device according to claim 1, wherein each of the reflectors includes a second reflection electrode finger including one end portion connected to the second reflector busbar and another end portion facing the first reflector busbar with a gap interposed therebetween; and
the second reflection electrode finger overlaps an entirety or substantially an entirety of the first gap region of the interdigital transducer electrode when viewed in the first direction.

8. The acoustic wave device according to claim 7, wherein the first busbar and the second busbar respectively include inner busbar regions in a vicinity of the intersection region and outer busbar regions outside the inner busbar regions in the second direction;
in the first busbar and the second busbar, the regions in which the cavities are provided are between the inner busbar regions and the outer busbar regions; and
the other end portion of the second reflection electrode finger overlaps a portion outside the first gap region in the second direction when viewed in the first direction.

9. The acoustic wave device according to claim 8, wherein the other end portion of the second reflection electrode finger overlaps the inner busbar region of the first busbar when viewed in the first direction.

10. The acoustic wave device according to claim 8, wherein the other end portion of the second reflection electrode finger overlaps the region in which the cavities of the first busbar are provided when viewed in the first direction.

11. The acoustic wave device according to claim 1, wherein each of the reflectors includes a third reflection electrode finger connected to the first reflector busbar and the second reflector busbar.

12. The acoustic wave device according to claim 11, wherein each of the reflectors includes a plurality of the third reflection electrode fingers.

13. The acoustic wave device according to claim 12, wherein the plurality of the third reflection electrode fingers include a reflection electrode finger nearest to the interdigital transducer electrode and a reflection electrode finger farthest from the interdigital transducer electrode in each of the reflectors.

14. The acoustic wave device according to claim 1, wherein
each of the first electrode fingers, each of the second electrode fingers, or both of the first and second electrode fingers include a first wide portion in the first edge region and having a width greater than that of a portion in the central region, and each of the first electrode fingers, each of the second electrode fingers, or both of the first and second electrode fingers include a second wide portion in the second edge region and having a width greater than that of the portion in the central region, where the widths are dimensions of the first electrode fingers and the second electrode fingers in the first direction.

15. The acoustic wave device according to claim 2, wherein
each of the first electrode fingers, each of the second electrode fingers, or both of the first and second electrode fingers include a first wide portion in the first edge region and having a width greater than that of a portion in the central region, and each of the first electrode fingers, each of the second electrode fingers, or both of the first and second electrode fingers include a second wide portion in the second edge region and having a width greater than that of the portion in the central region, where the widths are dimensions of the first electrode fingers and the second electrode fingers in the first direction.

16. The acoustic wave device according to claim 7, wherein
each of the first electrode fingers, each of the second electrode fingers, or both of the first and second electrode fingers include a first wide portion in the first edge region and having a width greater than that of a portion in the central region, and each of the first electrode fingers, each of the second electrode fingers, or both of the first and second electrode fingers include a second wide portion in the second edge region and having a width greater than that of the portion in the central region, where the widths are dimensions of the first electrode fingers and the second electrode fingers in the first direction.

17. The acoustic wave device according to claim 11, wherein
each of the first electrode fingers, each of the second electrode fingers, or both of the first and second electrode fingers include a first wide portion in the first edge region and having a width greater than that of a portion in the central region, and each of the first electrode fingers, each of the second electrode fingers, or both of the first and second electrode fingers include a second wide portion in the second edge region and having a width greater than that of the portion in the central region, where the widths are dimensions of the first electrode fingers and the second electrode fingers in the first direction.

* * * * *